US007917325B2

(12) United States Patent
Bredau et al.

(10) Patent No.: US 7,917,325 B2
(45) Date of Patent: Mar. 29, 2011

(54) METHOD FOR ERROR CONTAINMENT AND DIAGNOSIS IN A FLUID POWER SYSTEM

(75) Inventors: Jan Bredau, Esslingen (DE); Reinhard Keller, Ostfildern (DE)

(73) Assignee: Festo AG & Co. KG, Esslingen (DE)

( * ) Notice: Subject to any disclaimer, the term of this patent is extended or adjusted under 35 U.S.C. 154(b) by 0 days.

(21) Appl. No.: 12/085,341

(22) PCT Filed: Feb. 14, 2007

(86) PCT No.: PCT/EP2007/001269
§ 371 (c)(1),
(2), (4) Date: May 20, 2008

(87) PCT Pub. No.: WO2008/098589
PCT Pub. Date: Aug. 21, 2008

(65) Prior Publication Data
US 2010/0153026 A1 Jun. 17, 2010

(51) Int. Cl.
*G01L 5/08* (2006.01)
*G01R 31/00* (2006.01)

(52) U.S. Cl. ............................ 702/114; 702/45; 702/51

(58) Field of Classification Search .................... 702/35, 702/45, 47, 50, 51, 55, 140, 114; 72/15.1, 72/17.2, 357; 73/37, 861.42, 861.73, 864.25
See application file for complete search history.

(56) References Cited

U.S. PATENT DOCUMENTS 7,031,850 B2 * 4/2006 Kambli et al. .................. 702/51
2003/0187595 A1 10/2003 Koshinaka et al.

FOREIGN PATENT DOCUMENTS

DE 102005016786 11/2005
WO WO 2005/014353 2/2005
WO WO 2005/111453 11/2005

OTHER PUBLICATIONS

WO 2005/111433, Nov. 24, 2005, Bredau et al. (English translation).*

* cited by examiner

*Primary Examiner* — John H Le
(74) *Attorney, Agent, or Firm* — Hoffmann & Baron, LLP

(57) ABSTRACT

In a method for error containment and diagnosis in a fluid power system the fluid volumetric flow of the overall system or at least a part thereof or a quantity dependent thereon is detected as a measurement quantity respectively during an operating cycle and is compared with stored references. In each case at the point in time of a deviation or change in the deviation from the reference the method finds at which component or at which components (10 through 14) in the system an event has occurred influencing the fluid consumption in order to then to recognize same as subject to error. In the case of such a deviation or change therein and the simultaneous occurrence of several activities influencing fluid consumption by several components (10 through 14) a process of exclusion is performed, in which during the following activities involving at least one of such components (10 through 14) a check is made to see whether a deviation or a change in the deviation has occurred, and in each of such further examination steps the components involved are excluded from such further examination, if no deviation or change in the deviation takes place.

20 Claims, 2 Drawing Sheets

METHOD FOR ERROR CONTAINMENT AND DIAGNOSIS IN A FLUID POWER SYSTEM

This application claims priority based on an International Application filed under the Patent Cooperation Treaty, PCT/EP2007/001269, filed Feb. 14, 2007.

BACKGROUND OF THE INVENTION

The invention relates to a method for error containment and diagnosis in a fluid power system in which the fluid volumetric flow in the overall system or at least a part thereof or a quantity dependent thereon is detected as a measurement quantity in each case during a duty cycle and is compared with stored references and in each case at the point in time of a deviation or a change in the deviation from the reference it is determined at which a component or components of the system an event has occurred influencing fluid consumption in order to recognize same as subject to error.

In the case of such a method as described in the patent publication WO 2005/111433 A1 the air consumption curve is evaluated for error localization. In the case of deviations from a reference a conclusion is made from the point in time of the deviation as regards the faulty subsystem (for example a valve actuator unit) and, respectively, the faulty component. Such faults, which may occur in fluid power systems, are for example caused by wear of the components, faulty assembly, loose screw joints, porous hose, process errors or the like, which are expressed in movements of the fluid drives, and other seal defects of the most various different kinds. In order to avoid diagnosis errors due to changes in certain marginal conditions, such as pressure and temperature, the publication mentions possible correction of air consumption with the pressure and temperature. More particularly in the case of large fluid systems, in which a multiplicity of subsystems are simultaneously active, in the case of the known method it is not possible to see which of these components is faulty.

SUMMARY OF THE INVENTION

One object of the present invention is accordingly to so improve on a method of the type initially mentioned that even while the active and subsystems are simultaneously active the source of an error and more particularly of a leak, may be found in a clear manner as in a particular component or in a particular subsystem.

This object is to be achieved in accordance with the invention by a method with the features of claim 1 herein.

Using the method of the invention it is advantageously possible to localize the source of the leak in steps so that even in the case of a multiplicity of simultaneously active components or subsystems the source of the error may be found in a simple fashion. This then all the more constitutes a particular advantage since as a strictly sequential course of events in fluid systems and particularly in large fluid systems is a relatively rare occurrence. A further advantage is that only the actuator setting signals and a volumetric flow sensor are required to find the source of the leakage, that is to say, limit switches on the actuators are not absolutely necessary. The greater the difference between the axial movements are and the more different cycles that occur when the subsystems or components or a combination thereof are simultaneously moving, the greater the advantage of use of the method in accordance with the invention. In this respect an attempt is not only made to find the subsystems or components causing leakage, but also subsystems, components or actuator chambers clearly not involved are reliably excluded.

The dependent claims recite measures which are advantageous further developments and improvements in the method defined in claim 1.

As stored references fluid consumption reference curves, obtained from integrated volumetric flow values or guide value reference curves obtained from integrated guide value quantities (Q/P) have turned out to be particularly valuable, which are compared with corresponding measurement quantity curves.

A still further improvement in accuracy of the diagnosis and reliability in finding sources of leakage is achieved by the parameterizable compensation of the volumetric flow values or guide value quantities, the compensation occurring more particularly in a manner dependent on temperature and/or fluid and/or moisture and/or particle content of the fluid and/or time or events for different operational condition.

Preferably several parameter-dependent or, respectively, parameter-dependently compensated fluid consumption reference curves or guide value reference curves are stored in a selection matrix and may be selected or, respectively, set for the respective cycle, for example by checking them in sequence as regards correlation with the respective duty cycle.

The reference curves are preferably detected in a learn mode, particularly as well during later operation of the fluid power system.

In order to exclude the possibility of deviations from the measurement curve and reference curve being due to a timing error, preferably prior to diagnosis as regards leakage a curve comparison is performed as regards possible time shifts, so that in the case of a time shift exceeding a tolerance value there is a switch over to further stored reference curves for checking same or an error message and/or a stop instruction is produced for further leakage diagnosis.

In the leakage diagnosis in accordance with the invention, for a particularly advantageous evaluation difference values or a difference curve is formed between the measure quantity curve and the reference curve. This difference curve is preferably filtered in a frequency dependent manner by means of an integrator, which particularly involves a phase shift of −90 degrees in order to filter out interfering signal and interfering surges. A filtered compensation curve is obtained by computation of the increase of the integral of the difference values or difference curve, which then renders possible a particularly simple, designful evaluation.

One working example of the invention is illustrated in the drawings and will be described in the following account.

DETAILED DESCRIPTION OF THE PREFERRED EMBODIMENTS

Figure 1:
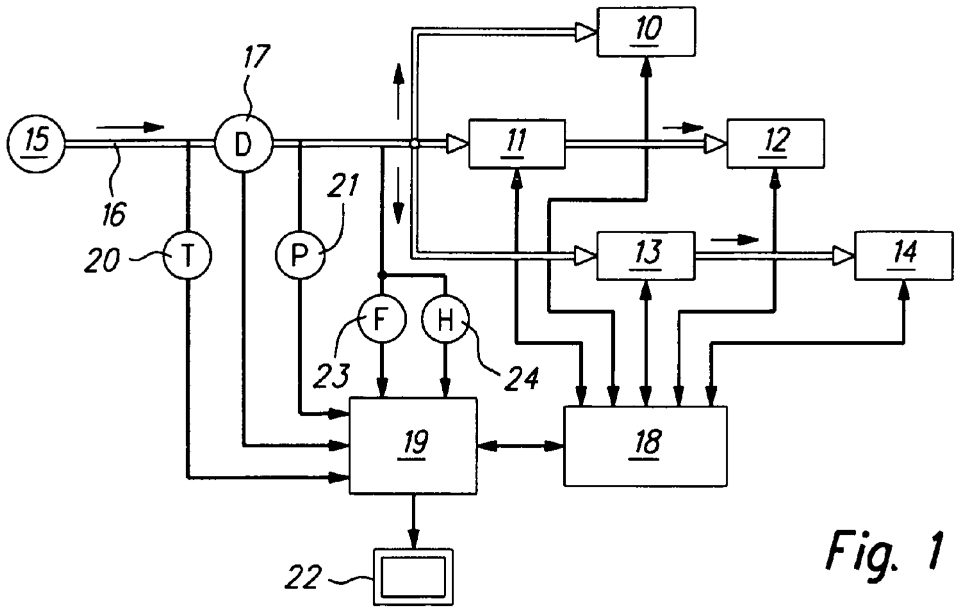
FIG. 1 shows a pneumatic system with a flow rate measuring instrument on the upstream side thereof.

In FIG. 1 a pneumatic system is diagrammatically represented, which could in principle be a different type of fluid system, for example a hydraulic system too.

The pneumatic system comprises four subsystems 10 through 14 or, respectively, components such as valves, cylinders, linear drives or the like and furthermore combinations thereof. These subsystems 10 through 14 are supplied by a pressure source 15, a flow rate measuring instrument 17 being placed on a common supply line for the flow rate and, respectively, the volumetric flow. The subsystems 11 and 12 on the one hand and the subsystems 13 and 14 on the other hand in turn form a respective system with a common supply duct.

An electronic control device 18 serves for setting the sequence of the process in the system and is electrically connected with the subsystems 10 through 14 by way of suitable control lines. The subsystems 10 through 14 receive control signals from the electronic control system 18 and send, sensor signals back again to same. Such sensor signals are for example position signals, limit switch signals, pressure signals, temperature signals or the like, which in the simplest case are not absolutely necessary.

The flow rate measuring instrument 17 is connected with an electronic diagnostic means 19, which additionally receives the signals of a temperature sensor 20 and of a pressure sensor 21 for measurement of the temperature T and of the pressure P in the supply duct 16, that is to say of the pressure of the fluid. Furthermore a fluid sensor 23 is present responsive to the type of fluid utilized and a moisture and/or particle sensor 24 are connected with the diagnostics means 19 for detecting the moisture content and the particle content of the fluid. The diagnostic means in addition has access to the sequence program of the electronic control device 18. The diagnostics data are supplied to a display 22, such data naturally also being stored, printed, optically and/or acoustically indicated or transmitted to a central facility by way of wires or in a wireless manner.

The sensors 22, 21 and also 23 and 24 may also be left out in the case of the simplest application, although at least one temperature sensor 20 and a pressure sensor 21 are appropriately provided.

The diagnostics means 19 may naturally also be integrated in the electronic control device 18, which for example may comprise a microcontroller for the performance of the sequence program and possibly for diagnosis.

In the case of an extremely large number of subsystems or, respectively, components, the latter be divided up into several groups, each group having its own flow rate measuring instrument 17 for diagnosis of parts of the system, associated with the groups, independently of each other, as is described in the initially mentioned prior art.

Figure 2:
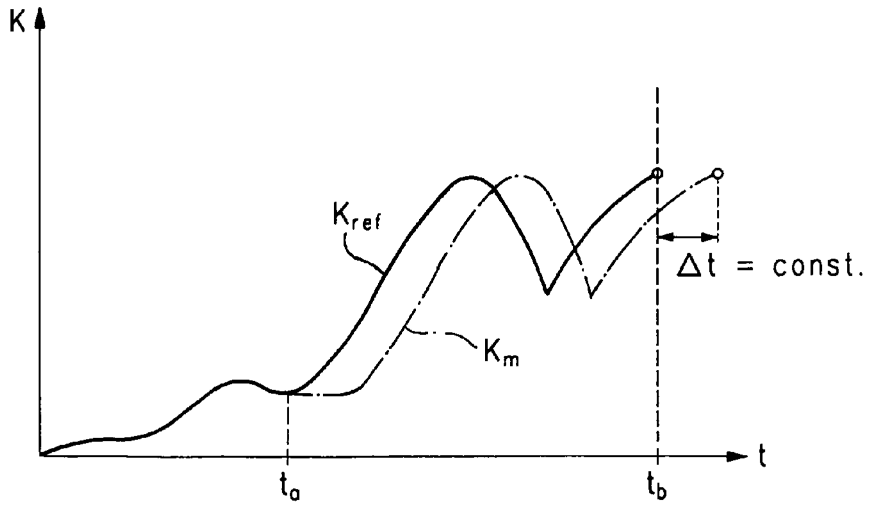
FIG. 2 is a guide value diagram to explain the occurrence of a shift in time between the measurement curve and the reference curve.

The method for error containment and diagnosis will now be explained with reference to the pneumatic system described and the guide value curves depicted in the FIGS. 2 and 3.

The diagnosis may in the simplest case be implemented by a comparison of the stored and selected fluid consumption reference curves with corresponding measurement quantity curves, the fluid consumption reference curves being constituted by integrated or summated volumetric flow values. Better results are achieved by the use of diagnosis guide values, the diagnosis guide value being a characteristic quantity of a fluid system or, respectively, of a fluid apparatus, which consists of many various subsystem. The guide value characterizes the behavior of the overall system over a defined cycle. Guide value reference curves are in the simplest case formed from integrated guide value quantities Q/P, Q being the respective volumetric flow value and P being the measured working pressure. These guide value reference curves are compared with corresponding measurement quantity curves, that is to say with measurement quantity curves constituted by integrated guide value quantities. The guide value quantities or, respectively, the guide value curves and guide value reference curves may be compensated for and improved upon by further measurement parameters, for example by the measured operating temperature T, the moisture content and/or the particle content of the fluid, the type of fluid and the respective time or event-dependent operational state. Such operational states are for example warming up, operation after prolonged idle times, restarting after retooling or operation after predeterminable time intervals, i. e. for example after operation for one hour, after ten hours or after several hours. The following explanation of error containment and diagnosis is on the basis of guide values, fluid consumption values also being able to be utilized accordingly.

The production of the reference curves requires a repeated cycle of the overall run. Non-cyclical processes may be represented in part cycles, to which the diagnosis method may then be applied. Various different operational states in a process may be allowed for by registering and storage of a set of reference curves in a selection matrix. This will also apply for the influence of different parameters.

For the evaluation it is now necessary for the respective measurement curve to the synchronized with the reference curve selected or to be selected, i. e. without any leakage the two curves correspond to each other but with leakage they are synchronized in time but show deviations in amplitude. The two curves to be compared must therefore be examined as regards correlation, i. e. it is necessary to see whether there have been shifts in time, for example owing to changed sequences within a cycle. If there are shifts in time past a set tolerance, then further evaluation of leakages is halted and a message as regards changes in the times of subsystems is generated. An error in time is recognized, when the value of the air consumption at the end of a cycle lies within a tolerance range, but the cycle time is different, as is illustrated in FIG. 2. In this case the two curves run in synchronism as far as the point in time to and as from this point is a time difference of Δt between the measurement curve Km and the reference curve Kref, which remains constant as far as the end of the cycle at the point in time tb. If a time error increases more and more in the course of the cycle, an attempt can be made to select another reference curve to produce a correlation. It is only when all stored reference curves have been examined without a correlation being reached that there is a faulty time shift or displacement and a subsequent leak diagnosis is not performed. A corresponding message may then be displayed, stored or passed on farther.

Figure 3:
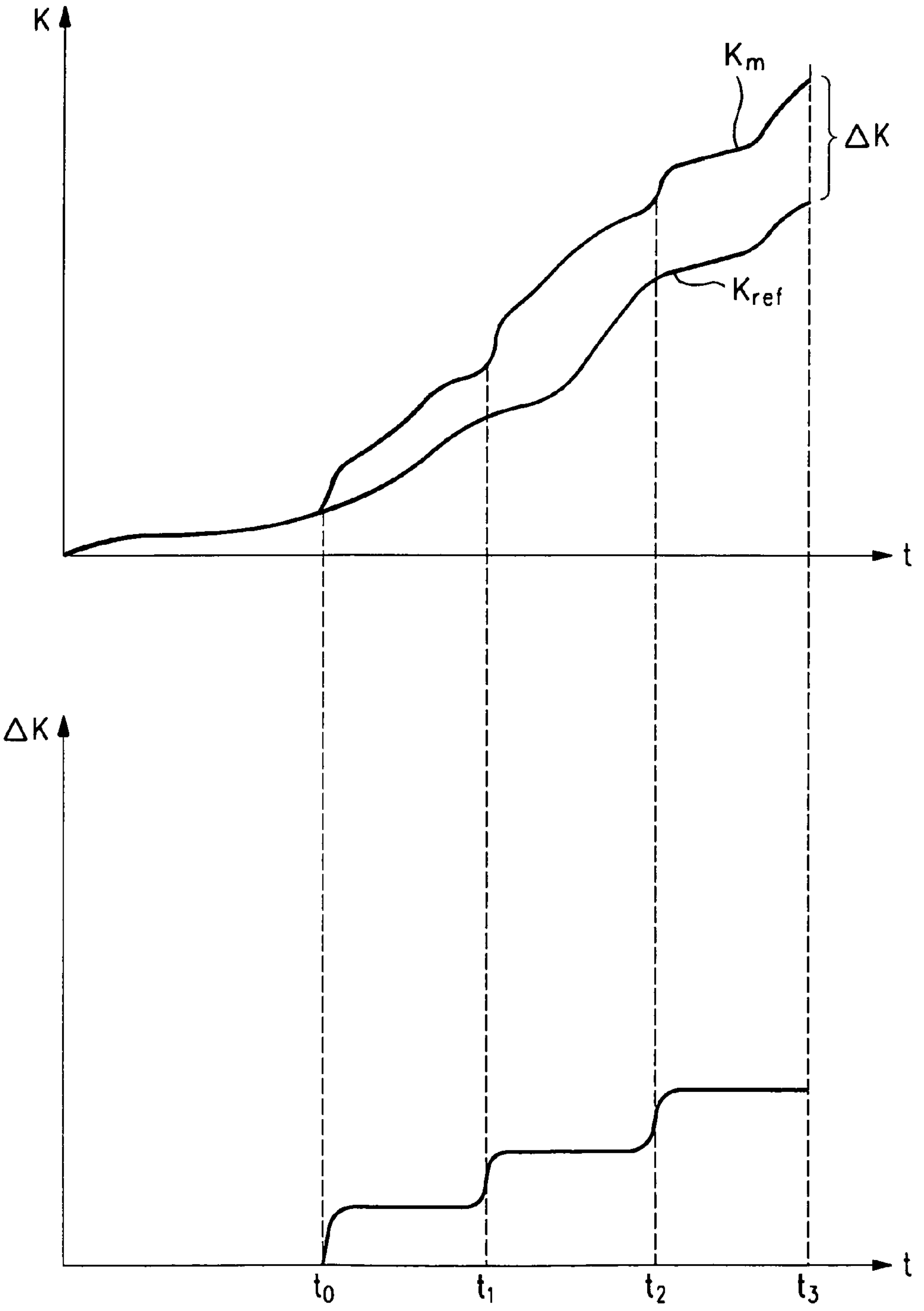
FIG. 3 is a guide value diagram to explain the leakage diagnosis.

If no time error is detected, in the next step the difference is formed from the nominal or, respectively, measurement value and the reference value, i. e. between the measurement quantity curve Km and the reference curve Kref, as is illustrated in FIG. 3 at the top. The difference curve so formed, which is represented in FIG. 3 at the bottom defines the summated distance of the measurement value curve from the reference curve at each point in time. The points in time for leakages represent the staircase-like increases in the difference. In the following evaluations these increases in the difference are assigned to the subsystems causing the leakage, or components or, respectively, actuator chambers.

In order to remove undesired fluctuations, interfering surges or the like the computed difference or difference curve can be filtered. In the case of conventional filtering procedures the change in the phase position and the amplitude is frequency dependent. In order for a frequency independent filtering operation to be performed, an integrator is employed, which has a fixed phase shift of −90 degrees. Accordingly in the case of later evaluation of the signalism no different phase shift must be taken into account. The amplitude response can be so set by changing the sampling time that in the desired frequency range there is a constant damping of the amplitude, while other frequencies are filtered out.

For the evaluation in the following a compensation function of the integral of the computed difference is formed. The choice of the corresponding compensation function may be made in accordance with the Gaussian principle of minimum squares. In this respect it is necessary to find which curve best suits the computed measure points of the difference. In the following a compensation straight line will be selected as the simplest possibility for a compensation function. It is clear that other compensation functions are possible. Every leak occurring is responsible for a change in the slope and the axis distance of the compensation straight line from the abscissae. In determining the slope from the integral of the difference there is a representation corresponding to the difference curve of FIG. 3, but however it is out of phase by minus 90 degrees. For computation of the axis distance from the integral in the difference there is also a representation corresponding to the difference curve illustrated in FIG. 3 but out of phase by minus 90 degrees and mirrored at the abscissae. The advantage of the computation of the compensation straight lines is that leaks, i. e. change in the slope in time, always have the same effect. Leaks taking effect at a later point in time in a cycle have a clearly stronger effect on the axis than leaks at the start of a cycle. In the rear portion in time of references there are greater errors with respect to the current value since they are summated. Accordingly real leaks change the axis distance, at a later point in time in the cycle substantially more distinctly than any deviations from the reference, for example owing to an alteration in the system. The evaluation described in the following takes both changes in the slope and also changes in the axis distance into account.

In the case of the compensation principle of the invention in the course of the error analysis certain areas may be excluded for the consideration of the same so that the number of the subsystems and components or respectively actuator chambers coming into question for a leak is reduced more and more. In this respect advantage is taken of the fact that it is never the same groups of subsystems which move at the same time, i. e. are active, and in other words the same actuator chambers are never simultaneously under pressure. Accordingly the actuator chambers coming into question are limited more and more and the diagnosis as regards leakage becomes more and more meaningful or more and more defined. For instance actuator chambers will be increasingly excluded from further consideration as regards leakage, when they are vented at one point in time and simultaneously there is no. In the following a diagnosis cycle will be described with reference to figure for example.

At the point in time t0 there is a leakage. At this point in time the chamber A of the subsystem 10, the chamber B of the subsystem 11 and the chamber A of the subsystem 12 are supplied with air. These three chambers may therefore come into question as the source of the leakage. Simultaneously the chamber B of the subsystem 10, the chamber A of the subsystem 11 and the chamber B of the subsystem 12 are inactive, and not supplied with air so that such actuator chambers may be excluded from further consideration.

At the point t1 in time there is a further leakage. At this point in time the chamber A of the subsystem 10, the chamber B of the subsystem 13 and the chamber B of the subsystem 12 is supplied with air. This means that the chamber B of the subsystem 11 is excluded from further consideration and that only the chambers A of the subsystems 10 and 12 come into question for the leakage.

At the point t2 in time the chamber A of the subsystem 10, the chamber B of the subsystem 14 and the chamber A of the subsystem 11 are supplied with air. The chamber A of the subsystem 11 has already been excluded from further consideration. The chamber A of the subsystem 12 is now also excluded as a source of the leak so that then it is possible to conclude that the chamber A of the subsystem 10 is responsible for the leak.

Frequently it is possible to locate the error producing system on the basis of a single increase in ΔK, that is to say in the case of a single occurrence of a leak. If for example, as a different form of the previously described example, a leak were to occur only at the point t0 in time at which the chamber A of the subsystem 10, the chamber B of the subsystem 11 and the chamber A of the subsystem 12 are all being supplied with air, and then at a later point in time again the chamber B of the subsystem 11 and the chamber A of the subsystem 12 are supplied with air, while the chamber A of the subsystem 10 is not participating, and no leakage occurs, the chamber B of the subsystem 11 and the chamber A of the subsystem 12 may be excluded as error producing components and it is then possible now to see that the chamber A of the subsystem 10 is the source of the error.

A particularly suitable form of evaluation, in particular in the case of an extremely large number of subsystems or, respectively, components entails providing each chamber of an actuator, i. e. in the case of one drive cylinder for example two chambers, with two counter. Furthermore a timer is provided for each chamber. The timer serves to additionally exclude actuator chambers or components from consideration as regards leakage. If a chamber or, respectively, a component is under pressure and no leakage occurs within a predetermined time value of the timer then this chamber will also be treated as not causing the leakage and will be excluded for further attempts to find the leak. The electrical subassemblies, i. e. counters and timers, are for example in the diagnosis means. On starting up an operating cycle the timers are started and on occurrence of leakage they are reset to zero respectively and held at zero until leaking stops. If now the respective chamber is under pressure in the reset state of the timer or at least during a part of the reset state time, then this chamber will come into consideration as being the source of the leakage and it is necessary to examine whether the slope and the axis distance of the compensation straight lines or some other compensation function has waxed by a predeterminable value or by a predeterminable percentage (as related for example to the respective maximum value of the (or one of the) preceding cycles. In this case the counter for the slope and/or the counter for the axis distance is incremented by the value of one. The more different the axis movements in the case of a multiplicity of subsystems or components moving simultaneously are and the more different cycles occur, the more exact this method be. In the case of every leakage, during which the corresponding component or chamber of a component is under pressure, the respective counters are incremented by a further respective count dependent on the increase in the slope and/or the axis distance. The counts of both counters of a chamber or of a component will be added together at the end of the cycle. That chamber, for which at the end of an operating cycle there is the highest total count, will be the chamber with the greatest likelihood for a leakage. The chamber or the component with the second highest overall count will be involved in the leakage with the second highest probability. This will be significant when several leakages occur in the system. If more than one set percentage has been detected at chambers, for example more than 50%, as causing the leakage, this is defined as system leakage. This method involves a stepped evaluation with the purpose of at least providing some hint even in the absence of a clear indication of the position of the leak for the servicing team.

In order to increase the accuracy of the analysis it is possible to consider several cycles. From the sum of the multiple analyses more exact information will then be obtained as regards the chamber or component causing the leakage or as regards the chambers or components causing it.

In a simpler design of the system it is also possible to provide only one timer for all chambers or components, which respectively during the occurrence of a leak is reset to zero and is held at zero during occurrence of the leak. During this period of time a check is made to see which chambers or components are active, i. e. are put under pressure.

In a simpler form of the method it is for example possible to evaluate only the axis distance or only the slope or a change therein. Then for each chamber, or for each component or for each subsystem only one counter will be necessary. A further simplification of the method is possible if there is no determination of the axis distance or the slope at all and only the counter of one chamber or one component is incremented by 1, if this chamber or component is receiving air during a part of the time of a leakage interval.

The invention claimed is:

1. A method for error containment and diagnosis in a fluid power system in which the fluid volumetric flow in the overall system or at least a part thereof or a quantity dependent thereon is detected as a measurement quantity in each case during a duty cycle and is compared with stored references and in each case at the point in time of a deviation or a change in the deviation from the reference it is determined at which a component or components of the system an event has occurred influencing fluid consumption in order to recognize same as subject to error, wherein, in the case of such a deviation or change in the deviation and simultaneous occurrence of several activities influencing the fluid consumption of several components an exclusion process is performed in which during following activities, in which at least one of such components is involved, in respective further examining steps an examination is performed as to whether in turn a deviation or change in the deviation occurs, in each of such further examining step the components involved being respectively excluded as not being subject to error from further examination, if no deviation or change in the deviation take place.

2. The method as set forth in claim 1, wherein, respectively in further examining steps in the case of a further occurrence of a deviation or change in the deviation the components not actively involved at this point in time are excluded as not being subject to error from the further examination.

3. The method as set forth in claim 2, wherein the stored references are fluid consumption reference curves formed from integrated volumetric flow values (Q) or guide value reference curves formed from integrated guide value quantities (Q/P), P denoting the measured working pressure, which are compared with corresponding measurement quantity curves.

4. The method as set forth in claim 2, wherein prior to the diagnosis for leakage there is a curve comparison as regards possible shifts in time, and in the case of a time shift exceeding a tolerance value there is a switch over to further stored reference curves for the examination thereof or an error message and/or a stop instruction with respect to further diagnosis is produced.

5. The method as set forth in claim 1, wherein the stored references are fluid consumption reference curves formed from integrated volumetric flow values (Q) or guide value reference curves formed from integrated guide value quantities (Q/P), P denoting the measured working pressure, which are compared with corresponding measurement quantity curves.

6. The method as set forth in claim 5, wherein prior to the diagnosis for leakage there is a curve comparison as regards possible shifts in time, and in the case of a time shift exceeding a tolerance value there is a switch over to further stored reference curves for the examination thereof or an error message and/or a stop instruction with respect to further diagnosis is produced.

7. The method as set forth in claim 1, wherein the volumetric flow values (Q) or the guide value quantities (Q/P) are compensated in a parameter dependent fashion, such fashion being temperature dependent and/or fluid dependent and/or moisture dependent and/or fluid particle content dependent and/or time or event dependent for different operating states.

8. The method as set forth in claim 7, wherein several parameter dependent fluid consumption reference curve or guide value reference curves are stored in a selection matrix.

9. The method as set forth in claim 8, wherein the reference curves are produced in a learn mode, particularly in later operation of the fluid power system too.

10. The method as set forth in claim 7, wherein prior to the diagnosis for leakage there is a curve comparison as regards possible shifts in time, and in the case of a time shift exceeding a tolerance value there is a switch over to further stored reference curves for the examination thereof or an error message and/or a stop instruction with respect to further diagnosis is produced.

11. The method as set forth in claim 1, wherein prior to the diagnosis for leakage there is a curve comparison as regards possible shifts in time, and in the case of a time shift exceeding a tolerance value there is a switch over to further stored reference curves for the examination thereof or an error message and/or a stop instruction with respect to further diagnosis is produced.

12. The method as set forth in claim 1, wherein, for leakage diagnosis difference values or a difference curve (ΔK) is produced between the measurement quantity curve (Km) and the reference curve {Kref).

13. The method as set forth in claim 12, wherein the difference curve (ΔK) is filtered in a frequency dependent fashion by means of an integrator, which has a phase shift of minus 90 degrees.

14. The method as set forth in claim 12 wherein a compensation function of the integral of the computed difference values or of the difference curve is formed, which best agrees with the computed measurement points of the difference.

15. The method as set forth in claim 14, wherein the compensation function is computed in accordance with the minimum square principle.

16. The method as set forth in claim 1, wherein, during the duration of a deviation, or a change in the deviation a timer is set at a predeterminable count and a comparison is performed as regards which component or which components were active during at least one time interval of such time duration.

17. The method as set forth in claim 16, wherein each component or each chamber of a component is provided with at least one counter, whose count is incremented by a count of one, when the component or chamber of the component is under pressure during at least one part of an interval in the existence of the set count of the timer.

18. The method as set forth in claim 17, wherein each component or each chamber is provided with an increment counter, whose count is respectively only incremented when the slope of the compensation function is incremented at least by a predeterminable value on the timer or percentage during the existence of the set value of the timer or of the active state of this component or chamber during the existence of such set value.

19. The method as set forth in claim 17 wherein each component or each chamber of a component is provided with an axis distance counter, whose count is respectively only incremented, when the axis distance of the compensation function is incremented at least by a predeterminable value or percentage during the existence of the set value of the timer or of the active condition such component or chamber during the existence of such set value.

20. The method as set forth in claim 17 wherein, at the end of an operating cycle, in the case of each component or each chamber, the counts of the slope counter and of the axis distance counter are added, the highest overall count or the highest overall counts being evaluated as the highest leakage probability for the respective component or chamber of a component.

* * * * *

UNITED STATES PATENT AND TRADEMARK OFFICE
CERTIFICATE OF CORRECTION

PATENT NO. : 7,917,325 B2
APPLICATION NO. : 12/085341
DATED : March 29, 2011
INVENTOR(S) : Bredau et al.

It is certified that error appears in the above-identified patent and that said Letters Patent is hereby corrected as shown below:

Column 4, line 35:

Reads: “point in time to and as”

Should read: --point in time ta and as--

IN THE CLAIMS:

Column 7, line 25:

Now reads: “1. A method for error containment and diagnosis in a fluid power system in which the fluid volumetric flow in the overall system or at least a part thereof or a quantity dependent thereon is detected as a measurement quantity in each case during a duty cycle and is compared with stored references and in each case at the point in time of a deviation or a change in the deviation from the reference it is determined at which a component or components of the system an event has occurred influencing fluid consumption in order to recognize same as subject to error, wherein, in the case of such a deviation or change in the deviation and simultaneous occurrence of several activities influencing the fluid consumption of several components an exclusion process is performed in which during following activities, in which at least one of such components is involved, in respective further examining steps an examination is performed as to whether in turn a deviation or change in the deviation occurs, in each of such further examining step the components involved being respectively excluded as not being subject to error from further examination, if no deviation or change in the deviation take place.”

Should read: --1. A method for error containment and diagnosis in a fluid power system comprising the steps of:

providing a measuring instrument, an electronic diagnostic means and an electronic control device in the fluid power system;

Signed and Sealed this
Thirty-first Day of July, 2012

David J. Kappos
*Director of the United States Patent and Trademark Office* detecting, with the measuring instrument, a fluid volumetric flow in the overall system or at least a part thereof or a quantity dependent thereon as a measurement quantity in each case during a duty cycle;

comparing, with the electronic diagnostic means and the electronic control device, said measurement quantity detected by the measuring instrument with stored references;

determining, with the electronic diagnostic means and the electronic control device, in each case at the point in time of a deviation or a change in the deviation from the reference at which a component or components of the system an event has occurred influencing fluid consumption in order to recognize same as subject to error;

performing an exclusion process, with the electronic diagnostic means and the electronic control device, in the case of such a deviation or change in the deviation and simultaneous occurrence of several activities influencing the fluid consumption of several components;

performing an examination, with the electronic diagnostic means and the electronic control device, in which during following activities, in which at least one of such components is involved, in respective further examining steps as to whether in turn a deviation or change in the deviation occurs, and respectively excluding, with the electronic diagnostic means and the electronic control device, the components involved in each of such further examining step as not being subject to error from further examination, if no deviation or change in the deviation take place.--

Column 7, line 57:

Now reads: "4. The method as set forth in claim 2,"

Should read: --4. The method as set forth in claim 1,--